United States Patent [19]

Gorinas

[11] 4,006,340
[45] Feb. 1, 1977

[54] DEVICE FOR THE RAPID DEPOSITING OF OXIDES IN THIN LAYERS WHICH ADHERE WELL TO PLASTIC SUPPORTS

[75] Inventor: Guy Gorinas, Annecy, France

[73] Assignee: Compagnie Industrielle des Telecommunications Cit-Alcatel, Paris, France

[22] Filed: Sept. 20, 1974

[21] Appl. No.: 507,845

[30] Foreign Application Priority Data

Sept. 28, 1973 France .............................. 73.34821

[52] U.S. Cl. .............................. 219/121 P; 427/34; 118/49.1
[51] Int. Cl.$^2$ ........................................... B23K 5/00
[58] Field of Search .................... 219/121 P, 76; 313/231.3; 315/111.2; 429/34; 118/49.1

[56] References Cited

UNITED STATES PATENTS

| | | | |
|---|---|---|---|
| 3,277,265 | 10/1966 | Reboux | 219/121 P X |
| 3,296,410 | 1/1967 | Hedger | 219/121 P |
| 3,614,510 | 10/1971 | Maskell | 219/121 P X |

*Primary Examiner*—Arthur T. Grimley
*Assistant Examiner*—G. R. Peterson
*Attorney, Agent, or Firm*—Sughrue, Rothwell, Mion, Zinn & Macpeak

[57] ABSTRACT

An apparatus consisting in forming, with the oxide to be sprayed on, a plasma in an arc state within a source cavity. The state is stabilized by various known methods but which are well-adapted and the substrate to be covered is preferably kept at a predetermined distance, in order of 50 cm, from the source cavity.

A positive pressure gas is supplied to the source cavity and vacuum pressure is maintained in the enclosure supporting the substrate facing the cavity opening to deposit oxide uniformly at high speed.

2 Claims, 1 Drawing Figure

U.S. Patent  Feb. 1, 1977  4,006,340
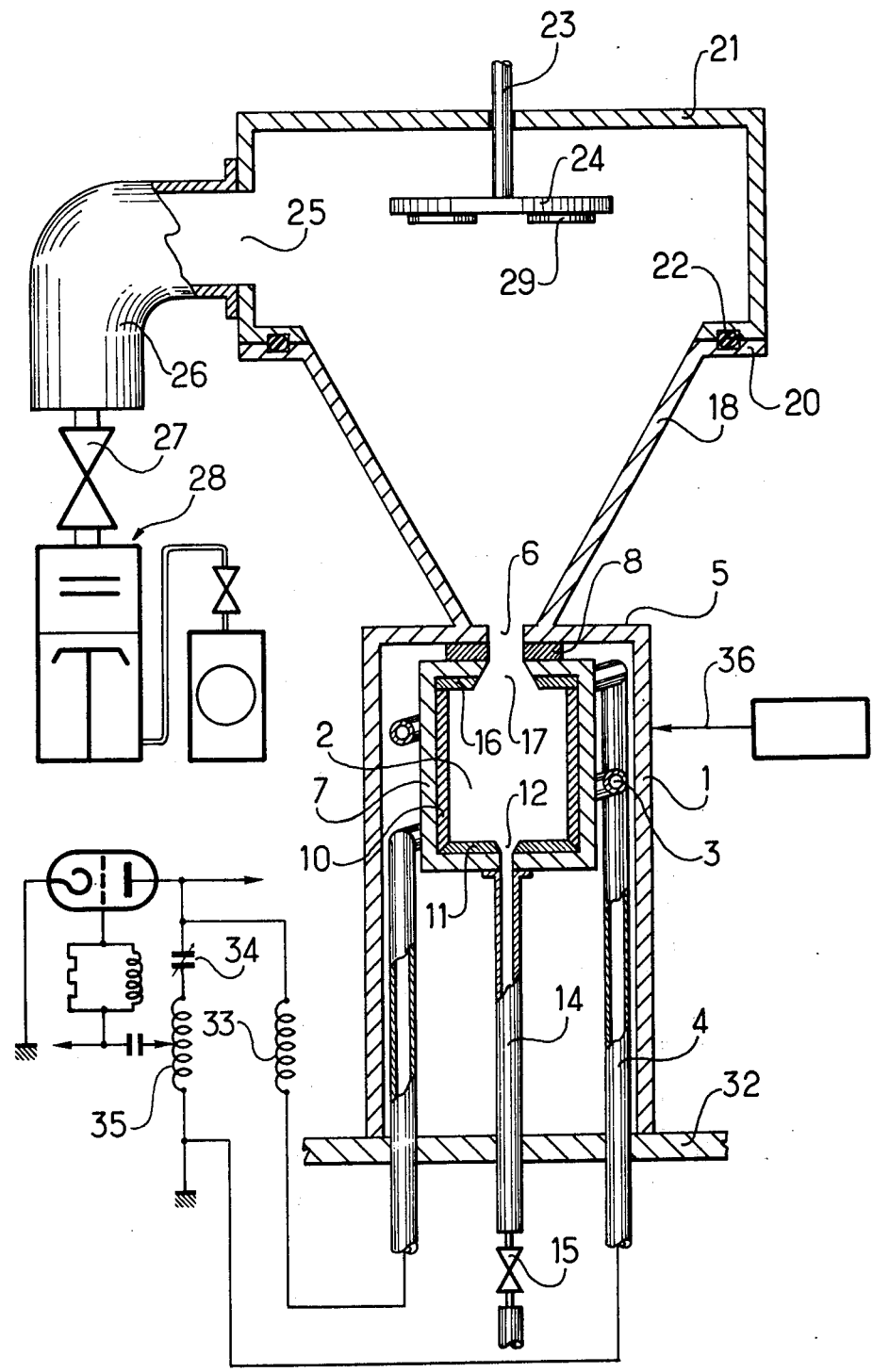

DEVICE FOR THE RAPID DEPOSITING OF OXIDES IN THIN LAYERS WHICH ADHERE WELL TO PLASTIC SUPPORTS

BACKGROUND OF THE INVENTION

1. Field of the Invention

The present invention concerns a method and device for the rapid depositing of oxydes in thin layers which adhere well to plastic supports.

2. Description of the Prior Art

It is known that there are several methods making it possible to deposit thin layers on a substrate. One of the best known methods, providing very adhesive layers is cathode sputtering. Nevertheless, the depositing speed is very slow, since it reaches about a hundredth of a micron per minute in the best cases and it is not possible to adapt that method to really industrial applications for large mass-producing operations. Another method which is also well-known consists in forming deposits by evaporation of the material to be deposited. That method makes it possible to operate at a very much higher depositing speed, but the layers thus deposited on the plastic support only very rarely give the user satisfaction.

The present invention aims at developing and applying a method, recently perfected, consisting in forming with the oxide to be sprayed, a plasma in an arc state and in spraying it onto the substrate kept in a vacuum.

Layers having excellent quality are thus obtained at a depositing speed 50 to 100 times higher than with cathode sputtering. It is known that according to that recent method, the discharge in an arc medium is induced within a cavity whose walls are lined with the material to be deposited. That cavity is drilled with an opening putting it into communication with the enclosure containing the substrate. When the arc medium is established, the particles of the material to be deposited are driven out of the cavity through the opening formed in the latter, penetrate in the enclosure where a lower pressure than in the cavity prevails, and come into contact with the substrate and are deposited thereon.

It is known that the discharge is an arc state thus set up has a tendency to increase in intensity if the latter is not controlled.

SUMMARY OF THE INVENTION

The aim which the inventor had in view when developing that oxyde depositing technology was to obtain a satisfactory evenness of the oxyde layer on a large plastic surface, as well as the slightest possible heating up of the plastic support, it being understood, moreover, that the layer thus obtained always retained all its adhesive qualities which the method used enables, whatever the type of the plastic substrate used may be and lastly that the depositing speed remained very high or was even improved each time this was possible.

According to the invention, the method perfected has for its object the rapid depositing of oxides in thin and adhesive layers on plastic substrates arranged in an enclosure kept under vacuum, opposite the circular opening of a source cavity internally lined with the oxides to be deposited, the said source cavity being kept, by means of injected oxygen, at a pressure higher than that prevailing in the enclosure, a plasma in an arc state being formed in the said source cavity by the high-frequency excitation of an induction coil surrounding the said source cavity, characterized in that to obtain an even layer, on the one hand, the arc state of the discharge is stabilized and on the other hand, the plastic supports to be coated are moved away from the said circular opening 17 along the axis of the latter.

The discharge in an arc state which is set up in a device applying the aforementioned method tends to increase in intensity, to rapidly set up vaporing of the material lining the cavity to modify the depositing state and more particularly to alter the evenness of the layer deposited. The stabilizing of the arc state is therefore a necessary condition to achieving evenness of the layers. Circumstances therefore lead to the compulsory introducing of a means for stabilizing the arc. Moreover, having observed that for a given structure of the device, the evenness of the layer deposited increased with the distance at which the plastic support was placed from the circular opening of the cavity, the inventor has been induced to impart to the structure of the device a particular shape making it possible to bring the distance between the circular opening of the cavity and the plastic support to 500 mm and more, this being nearly 10 times the diameter of the cavity. For the free flow of the particles of the material to be deposited to be sufficient, it is necessary to reduce the pressure in the enclosure while maintaining a pressure 10 to 100 times higher within the cavity, that condition enabling simultaneously the increasing of the depositing speed in very appreciable proportions. Lastly, by moving the plastic support away from the opening circular opening of the cavity, the heating up thereof is simultaneously reduced.

In this way, the device implementing the method according to the invention, enabling the rapid depositing of thin and adhesive layers of oxides on the surface of plastic supports is constituted by:

an enclosure provided with a pumping unit ensuring a high vacuum to the enclosure;

a source cavity cylinder internally lined with a layer of oxide to be deposited, closed at its lower part by a plug through which a gas injection tube passes and provided, at its top, with a circular axial opening, an excitation winding of the source cavity formed by turns of a conductor tube internally cooled and electrically connected to an oscillating circuit provided with adjusting means;

a starter placed at the level of the source cavity;

a plastic substrate fixed on a substrate support and placed substantially on the axis of the axial circular opening of the source cavity cylinder and facing the opening;

characterized in that the distance between the substrate to be coated and the axial circular opening of the source cavity cylinder is greater than several times the diameter of the said source cavity cylinder.

The upper part of the enclosure is generally cylindrical and its diameter itself is also greater than several times the diameter of the source cavity cylinder.

The lower part of the enclosure in the vicinity of the source cavity cylinder may, on the contrary, have a diameter which is nearly the same as or slightly greater than that of the cavity. In that case, the connection of the upper part of the enclosure with the lower part is effected by means of a truncated cone whose wall opens at an angle of 60° or more.

The lower part of the enclosure in the vicinity of the cavity may, on the contrary, have the same diameter as the upper part, the enclosure as a whole then having the shape of a cylinder whose diameter is that of the upper part of the enclosure whose lateral walls are spaced apart from the source cavity. The electromagnetic field is then concentrated within the source cavity cylinder by a concentration means formed essentially by two concentric conductive cylinders electrically connected together, constituting the secondary winding of an impedance transformer whose primary winding is formed by the induction coil. In this way, it may be considered that in all cases, an induction coil is placed in the immediate vicinity of the cavity, either inside the enclosure or outside the latter. The stabilization of the current may be obtained as previously by inserting in the primary winding a fixed inductance. That stabilization has also been obtained by inserting a regulator of a known type, in the feeding of the primary circuit and by controlling it with a voltage by a tap at the terminals of a turn of the primary winding.

DESCRIPTION OF THE DRAWING

The example of embodiment described hereinbelow and the digital values, given by way of an example having no limiting character, concerning the depositing of silica on plastic supports by deposits of various oxides such as, more particularly, chromium oxide, tin oxide, and indium oxide, have been formed on plastic supports without making appreciable modifications to the apparatus implemented so that the following description may have a general character all although it is made with reference to:

The single FIGURE showing diagrammatically an installation for depositing a thin layer of silica at the surface of a support made of a plastic material.

DESCRIPTION OF THE PREFERRED EMBODIMENT

A cylindrical casing surrounding the source cavity 2 may be seen at 1. According to one embodiment, the induction coil 3 is shown in the form of two turns of a hollow conductor inside which a cooling fluid flows. The cylindrical casing 1 extends, in its upper part, by a circular plate 5 drilled with an opening 6. The casing 7 or source cavity cylinder forming the source cavity supports, at its upper part, a fluid-tight ring 8 preventing the ingress of polluting substances into the induction coil 3. In other embodiments (not shown), the induction coil is situated outside the cylindrical casing 1 surrounding the source cavity 2, but then, a means for concentrating the field is applied inside the enclosure and the turn of the said concentrator which is the nearest of the source cavity 2 is cooled directly or indirectly by a circuit of cooling fluid, so that in general cases, the wall of cylinder 7 of the cavity is cooled.

Internally, the source cavity cylinder 7 is lined with one or more cylinders 10 of silica; the bottom of the source cavity cylinder 7 is covered with a silica washer 11 drilled with an opening 12 at which a tube 14 supporting, by means of the plate 32, the cylinder 7 of the source cavity terminates. That tube is used for injecting the gas, in this case oxygen; its discharge is regulated by a microvalve 15. A silica washer 16 completes the forming of upper part of the cavity. That washer 16 carries a circular driller axial opening 17 centred on the circular opening 6.

The circular plate 5 limiting the cylindrical part of the enclosure 1 is connected in a fluid-tight manner to a truncated cone shaped casing 18 which tapers upwards and whose axial cross-section open at an angle of more than 60°.

The upper end of the truncated cone shaped casing 18 is extended horizontally by a circular plate 20 on which rests the upper part 21 of the enclosure through an O-ring 22. That element 21 assumes the form of an inverted draining tank. At its centre, the upper part $a1$ of the enclosure supports an axle or shaft 23, supporting the substrate support 24 and in turn the substrate 29. A circular flange 25 makes it possible to connect up the pumping tube 26 to the enclosure, tube 26 being provided with a valve 27 and connected to the pumping unit 28 having a high discharge capable of providing a vacuum of less than $10^{-6}$ Torr.

The enclosure is therefore constituted by the cylindrical tube 1 bearing in a fluid tight manner on a support plate 32, extended by the truncated cone shaped casing 18 which tapers upwards and connects up at its upper part 21 of the enclosure.

The installation most frequently used has the following dimensions:
the source cavity cylinder has a diameter of 50 mm on the outside and 30 mm on the inside;
the circular opening 12 drilled in the upper disk 16 is 10 mm. The total height of the source cavity 2 is 50 mm.
the distance between the circular opening 17 and the substrate is adjustable between 200 mm (the substrate support being sunk into the truncated cone shaped casing 18) and more than 500 mm (the substrate 29 being in the upper part 21 of the enclosure).

The electric circuitry used makes it possible to stabilize the intensity of the discharge of the arc which is indispensable for any industrial operation of the device. The high-frequency oscillating circuit comprises a self-inductance 33, a reaction self-inductance 35 connected in series with the induction turn 3 in the oscillating circuit which may be adjusted by the capacity 34. The adjustment for power is effected by a self-transformer (not shown). When the arc state is reached, the induction turn 3 may be considered as being in short-circuit; the total self inductance of the circuit becomes the sum of the self inductances 33 and 35; the impedance of the oscillating circuit decreases slightly, so that the anode current increases only slightly (in the order of 10 percent) instead of causing the racing of the rate, which would not fail to occur with a circuitry in which the induction turn is not connected in series with a high impedance.

The priming of the discharge is obtained through a starter arranged on the outside or on the inside of the enclosure, at the level of the cavity.

The operation of the device requires firstly the setting up in the enclosure of a vacuum in the order of $10^{-6}$ Torr. Then, oxygen is brought into the source cavity 2 to form a pressure in the order of 2 to $7.10^{-3}$ Torr therein, the pressure in the cavity which depends on the diameter of the circular opening 17 of the source cavity 2 and on the discharge of the pumps 28 is set up in the present case according to the discharge of these latter at a value comprised between $2.10^{-5}$ Torr to $7.10^{-4}$ Torr, the first value being preferred, as much because of the higher depositing speed observed as because of the high pressure gradient which appears at the opening of the cavity. Nevertheless, it is sufficient for the ratio between the pressures to be in the order of 10, the pressure in the enclosure under vacuum being, for example, $7.10^{-4}$ Torr and whereas the pressure in the cavity is $7.10^{-3}$ Torr. The gradient of the pressures thus obtained is then sufficient to reach a perfectly even adhesive and rapid deposit of the oxide on the substrate.

When these pressures are reached and a high-frequency adjustable between 2 and 6 Mc/s is applied, the rate which is formed as soon as priming is obtained by means of the starter 36 in the cold discharge rate, causes the plasma to have a light blue colour. After a certain time, the plasma becomes enriched; it turns a very intense blue colour, rich in ultra-violet rays; the arc state is primed and depositing in the arc state begins.

Throughout the whole operation, the anode voltage remains constant and equal in general to 6 KV in the aforementioned circuitry. The anode current which is 1 ampere without load assumes the value of 1.1 ampere when the plasma is formed and reaches 1.4 ampere in the arc state due to the limiting of the current imposed by the self inductance. These few experimental details make it possible for the man in the art to convince himself thoroughly that the process observed is totally different from cathode sputtering in an oxygen plasma.

The deposits obtained easily reach a thickness of 3 microns while remaining perfectly homogenous and adhesive.

In the axis of the source, a depositing speed in the order of 2 microns per minute at a distance of about 200 mm from the source has been observed. The depositing speed decreases with the axial distance, increase between the substrate and the source cavity, and it is no longer greater than 0.5 micron per minute at an axial distance of 400 mm, this being absolutely normal because of the angle of opening of the plasma beam leaving the circular opening of the source cavity.

The distribution in space of the thickness of the deposit on a plane substrate closely follows the ideal curve of the law of the emission in a cosine for a source having a small surface. It is observed that the law is all the better followed as the axial distance between the substrate and the circular opening of the source cavity is made larger. Thus, at an axial distance of 200 mm, the deviation between the ideal curve and the thickness measured is 20 percent but at a distance of 500 mm, the deviation is no more than 5 percent.

For a source cavity having a diameter of 50 mm, it is therefore an advantage to place the substrate an axial distance from the cavity opening at least equal to 4 times the diameter of the cavity.

At 200 mm, depositing is rapid, but the variation of the thicknesses is still fairly far away from the ideal curve. At 400 mm, (8 times the diameter of the source cavity) the depositing speed is still in the order of half a micron per minute and the variation in thickness of the deposit is less than 10 percent from the ideal layer. At 500 mm (10 times the diameter of the source cavity) the depositing speed is less than half a micron per minute but on the other hand the continuity of thickness is virtually perfect.

These last two distances have been selected as preferred limits.

The operations for depositing layers on plastic materials having a determined shape can be effected in a way which constitutes an advantage only if the temperature of the substrate does not reach high values liable to produce any alteration in shapes. At the distances selected, the temperature of the substrates never exceeds 50° C.

The quality of the deposits has been examined under two other aspects:

its resistance to weather, cold, rain, wind, sun, dust, has been tested during several months but without any alteration in the deposit having been observed with a microscope.

The resistance to abrasion has been determined by the rubbing of a organic body loaded with grains of abrasive material whose pressure on the layer is determined by additional weights which tend to press the frication surface against the sample.

It has been observed that the majority of plastic substances on which experiments were carried out on the bare substance were scored as soon as the additional weight reached 10 grammes.

On the other hand, the scores did not appear on a deposit of 2 microns having a thickness of 2 microns except with additional weights of 200 grammes.

Lastly, on a deposit having a thickness of 3 microns, it has been possible to make scores appear even with an additional weight of more than 800 g.

These various experiments and the technology perfected show that it is possible now to effect according to the method and the device described above, the coating with a layer thin but perfectly protective and transparent layer of silica, of various objects of an industrial nature, such as glasses for spectacles, and watches, screens, masks and helmets for motor-cycle riders, pilots, etc., cockpits for cars, aeroplanes, wind screens, etc.

Although the device which has just been described may appear to afford the greatest advantages for the implementing of the invention in a particular technical situation, it will be understood that various modifications may be made thereto by the man in the art without going beyond the scope of the invention, more particularly when it is required to obtain a homogenous deposit of oxyde on a surface having a particular shape or a simultaneous deposit on the two sides of a substrate made of a plastic material.

What is claimed is:

1. In a device for the rapid depositing of thin even and adhesive layers of oxides on plastic substrates, said device comprising:
    an enclosure,
    a pumping unit for providing a high vacuum to said enclosure,
    a source cavity cylinder internally lined with a layer of oxide to be deposited,
    a gas injection tube passing through the bottom of said cylinder,
    and means for subjecting said tube to gas under pressure,
    said cylinder having an axial circular opening therein facing the substrate,
    a hollow conductor tube in juxtaposition with said cylinder forming an excitation winding for said cylinder,
    means operably connected to said conductor tube for internally cooling said conductor tube;
    oscillating circuit means electrically connected to said conductor tube, and
    means to adjust said oscillating circuit means to thereby create a plasma arc;
    a plastic substrate;
    substrate support means disposed along the longitudinal axis of said axial circular opening in said cylinder, with said substrate support means supporting said substrate within said enclosure and facing said circular opening;

the improvement wherein:

said enclosure comprises a first cylindrical part closely surrounding the source cavity cylinder and being concentric thereto, a truncated cone shaped element having the same axis of symmetry as the circular opening of the source cavity cylinder with the axial cross section defining an opening of 60° fixed to said cylindrical part and extending axially from said first part at said opening towards said substrate, a large diameter cylindrical element connected to the truncated cone shaped element remote from said opening, the diameter of said large diameter cylindrical element being equal to that of said truncated cone shaped element at its base and being connected thereto, means for stabilizing said arc;

and wherein the substrate support means fixes said substrate at a distance from the axial circular opening of the source cavity which is greater than four times the diameter of said source cavity and the diameter of the axial circular opening of the source cavity, the diameter of the cavity cylinder, said pumping unit applies vacuum pressure to the enclosure, and said means for subjecting said gas injection tube to gas under pressure applies positive gas pressure to the source cavity, such that the pressure differential between the source cavity and the enclosure under vacuum pressure is on the order of 10 to facilitate deposition of oxide on said substrate at a very high speed without compromising uniformity of oxide deposition.

2. The device for the rapid depositing of oxides in thin, even and adhesive layers on plastic substrates according to claim 1, wherein the means for stabilizing the arc comprises a self inductance connected up in series in the oscillating circuit, said self inductance having a value greater than that of the excitation winding.

* * * * *